US012055276B2

(12) United States Patent
Xu

(10) Patent No.: US 12,055,276 B2
(45) Date of Patent: Aug. 6, 2024

(54) AUTOMOTIVE LED LIGHT SOURCE WITH GLASS LENS OVER A GLASS CONVERTER PLATE CONTAINING PHOSPHOR

(71) Applicant: Bridgelux, Inc., Fremont, CA (US)

(72) Inventor: Tao Xu, Fremont, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

(21) Appl. No.: 17/978,749

(22) Filed: Nov. 1, 2022

(65) Prior Publication Data
US 2023/0047719 A1 Feb. 16, 2023

Related U.S. Application Data

(63) Continuation of application No. 17/226,080, filed on Apr. 9, 2021, now Pat. No. 11,512,817, which is a continuation of application No. 16/266,094, filed on Feb. 3, 2019, now Pat. No. 10,982,823.

(60) Provisional application No. 62/639,946, filed on Mar. 7, 2018.

(51) Int. Cl.
H01L 33/50 (2010.01)
F21K 9/64 (2016.01)
F21S 41/151 (2018.01)
H01L 25/075 (2006.01)
H01L 33/60 (2010.01)
H01L 33/62 (2010.01)

(52) U.S. Cl.
CPC .............. F21K 9/64 (2016.08); F21S 41/151 (2018.01); H01L 25/0753 (2013.01); H01L 33/502 (2013.01); H01L 33/505 (2013.01); H01L 33/60 (2013.01); H01L 33/62 (2013.01)

(58) Field of Classification Search
CPC ......... F21K 9/64; F21S 41/151; F21S 41/147; F21S 41/19; H01L 25/0753; H01L 33/502; H01L 33/505; H01L 33/60; H01L 33/62; H01L 33/58; H01L 33/501; H01L 33/48; H01L 33/50
See application file for complete search history.

(56) References Cited

U.S. PATENT DOCUMENTS

2005/0269582 A1  12/2005  Mueller et al. ......... H01L 29/22
                                              257/94
2006/0245201 A1  11/2006  Wada et al. ............. B60Q 1/00
                                              365/545

(Continued)

Primary Examiner — Elias Ullah
(74) Attorney, Agent, or Firm — Imperium Patent Works; Darien K. Wallace

(57) ABSTRACT

A lighting system that is part of a headlight module of a motor vehicle includes an array of LED light sources that include no organic materials. Each light source includes a glass lens attached to a phosphor glass converter plate, which itself is attached to an LED die that is flip-chip mounted on a mounting substrate. The converter plate includes phosphor particles embedded in glass. Each lens is disposed laterally over a single LED die. The converter plate is attached to the LED die by a first bonding layer, and the lens is attached to the converter plate by a second bonding layer. Both bonding layers are made of a metal oxide and are thinner than the converter plate. Either each lens does not extend horizontally outside the lateral boundary of each converter plate, or the lens portions centered on each LED die are part of a unitary lens array.

21 Claims, 7 Drawing Sheets

(56) References Cited

U.S. PATENT DOCUMENTS

| | | | |
|---|---|---|---|
| 2008/0026498 A1* | 1/2008 | Tarsa | H01L 33/58 257/E33.059 |
| 2009/0103321 A1 | 4/2009 | Weijers | F21V 9/08 362/510 |
| 2011/0075438 A1 | 3/2011 | Shirai et al. | B60Q 1/04 362/538 |
| 2012/0171789 A1 | 7/2012 | Suehiro et al. | H01L 33/52 438/28 |
| 2013/0063024 A1 | 3/2013 | Wada et al. | H01L 33/56 313/512 |
| 2018/0122993 A1 | 5/2018 | Camras et al. | H01L 33/44 |
| 2018/0190876 A1 | 7/2018 | Liu et al. | H01L 33/62 |

* cited by examiner

AUTOMOTIVE LED LIGHT SOURCE WITH GLASS LENS OVER A GLASS CONVERTER PLATE CONTAINING PHOSPHOR

CROSS REFERENCE TO RELATED APPLICATIONS

This application is a continuation of, and claims priority under 35 U.S.C. § 120 from, nonprovisional U.S. patent application Ser. No. 17/226,080 entitled "Automotive LED Light Source with Glass Lens Over a Glass Converter Plate Containing Phosphor," filed on Apr. 9, 2021, now U.S. Pat. No. 11,512,817. Application Ser. No. 17/226,080, in turn, is a continuation of, and claims priority under 35 U.S.C. § 120 from, nonprovisional U.S. patent application Ser. No. 16/266,094 entitled "Automotive LED Light Source with Glass Lens Over a Glass Converter Plate Containing Phosphor," filed on Feb. 3, 2019, now U.S. Pat. No. 10,982,823. Application Ser. No. 16/266,094, in turn, claims priority under 35 U.S.C. § 119 from U.S. Provisional Application No. 62/639,946, entitled "Automotive LED Light Source with Glass Lens Over a Glass Converter Plate Containing Phosphor," filed on Mar. 7, 2018. The subject matter of each of the foregoing documents is incorporated herein by reference.

TECHNICAL FIELD

The present invention relates to LEDs used in automotive applications, such as in vehicle headlights.

BACKGROUND INFORMATION

Light sources using light emitting diodes (LEDs) are increasingly being used for vehicle headlights because the LEDs exhibit lower power consumption and have a longer operational life than do the halogen or high-intensity-discharge (HID) lamps previously used for vehicle headlights. However, typical LED light sources that are used in automotive applications do not display the same reliability that is achievable with LEDs in other applications. For example, the LEDs in vehicle headlights are driven with large currents in order to produce the high-intensity white light needed for high beam headlights. The white light is obtained using phosphor that converts some of the blue light generated by Gallium Nitride (GaN) LEDs into longer wavelength light so that the combined light emitted by the LED light source will have a wider band of wavelengths and will appear whiter. Particles of phosphor are typically held in silicone or epoxy resins deposited over the LED dies. The large currents used to generate high-intensity white light generate large amounts of heat that is difficult to extract completely with heat sinks and that inevitably raises the temperature of the automotive LED light sources beyond the usual operating temperatures of LEDs in other lighting applications. The LEDs in light sources for general lighting applications typically have operating temperatures that do not exceed 105° C. over extended periods. However, the operating temperature for LEDs in vehicle headlights can often reach 125° C.

The emission efficiency and light intensity of LEDs in vehicle headlights is often reduced because the resin matrix of the silicone and epoxy that hold the phosphor particles deform under the extended periods of high temperature and the vibration and bumping from road conditions while the resins are at the elevated temperatures. A design for an LED light source is sought that can produce high-intensity white light in an automotive application with at least the same reliability that is currently achievable with LEDs used in other lighting applications that have lower maximum operating temperatures and that involve less vibration.

SUMMARY

A lighting system that is part of a headlight module of a motor vehicle includes an array of LED light sources. The light sources include no organic materials such as silicone or epoxy, whose matrix structures break down under the combination of high temperature, humidity and vibration associated with the operating conditions of a vehicle headlight. Each LED light source includes a glass lens attached on top of a converter plate of phosphor glass. The converter plate is attached on top of an LED die that is flip-chip mounted to a mounting substrate. The LED die has surface mount contacts that include an n-contact and a p-contact. An n-trace and a p-trace are disposed on a top surface of the mounting substrate. The n-contact directly contacts the n-trace, and the p-contact directly contacts the p-trace.

The converter plate includes phosphor particles embedded in glass or ceramic. Each lens is disposed laterally over a single LED die such that there is one lens per LED die. The converter plate is attached to the LED die by a first bonding layer, and the lens is attached to the converter plate by a second bonding layer. Each of the bonding layers is made of a metal oxide and is thinner than the converter plate. The converter plate has a thickness of 60-100 microns, and each of the bonding layers is less than one micron thick. A reflective material includes light scattering particles dispersed in a transparent carrier. The reflective material is disposed between a first LED light source and a second LED light source of the array.

In one embodiment, each lens does not extend horizontally outside the lateral boundary of each converter plate. For example, the portions of a hemispherical lens that would extend outside the lateral square boundary of the converter plate are cut off. The LED light sources can be spaced closely together at a separation of 50-100 microns because the edges of the lens are truncated and do not extend beyond the lateral boundary of the converter plate or the LED die. In another embodiment, each lens portion of a unitary lens array is centered over each LED die. The unitary lens array covers multiple LED light sources. The lens portions are arranged on the unitary lens array such that the LED light sources can be spaced closely together at a separation of 50-100 microns. In yet another embodiment, the converter plate of one LED light source and the converter plate of another LED light source are portions of a unitary converter plate that covers multiple LED dies.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to examples and some embodiments of the invention, examples of which are illustrated in the accompanying drawings. In the description and claims, terms such as "upward", "downward", "upper", "lower", "above", "beneath", "inward" and "outward" are used to describe relative directions and orientations between different elements of the lighting system, and it is to be understood that the overall structure being described can actually be oriented in any way in three-dimensional space.

Figure 1:
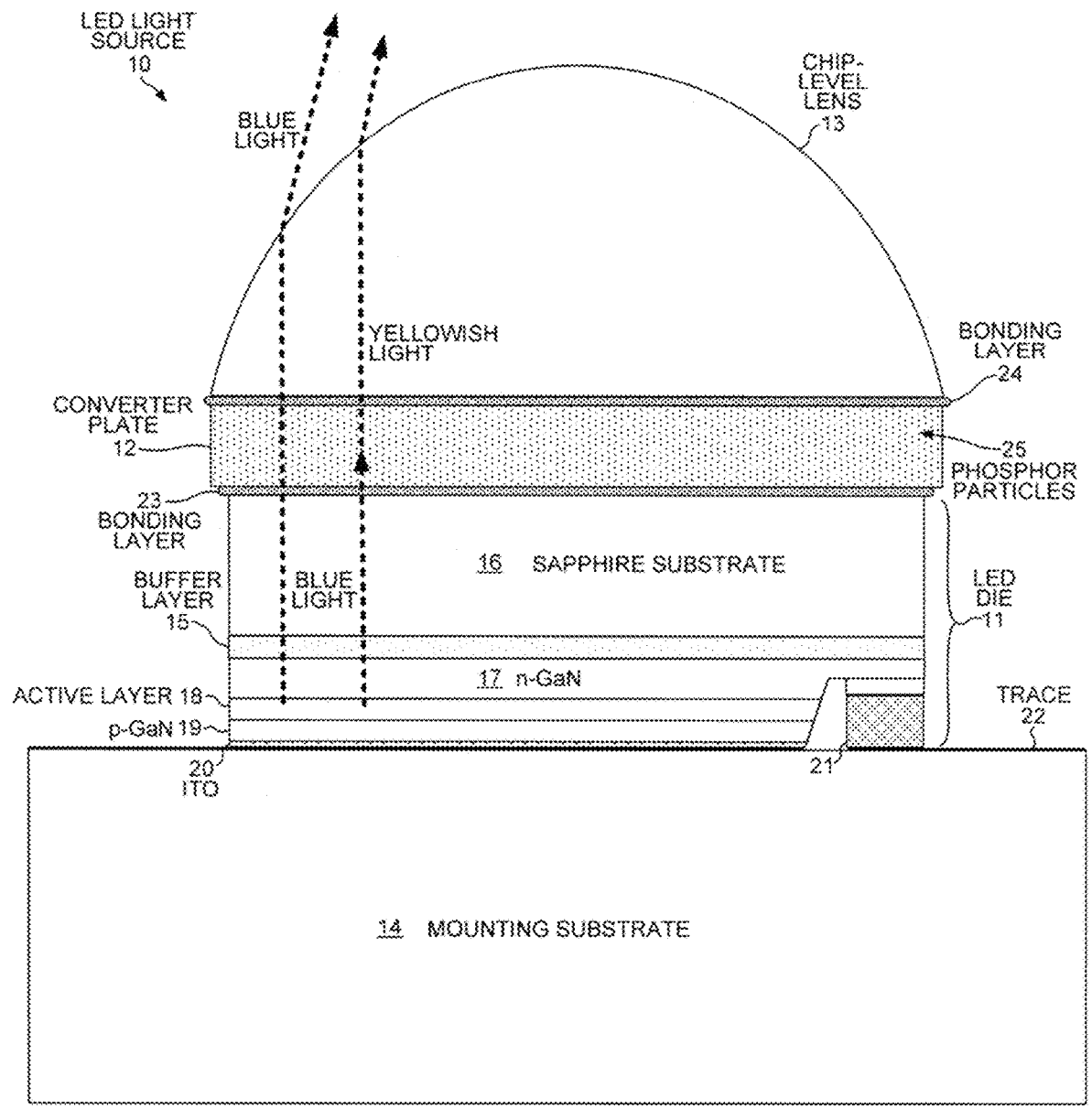
FIG. 1 is a cross-sectional view of an LED light source used in a vehicle headlight that includes an LED die, a converter plate and a lens.

FIG. 1 is a cross-sectional view of a single light emitting diode (LED) light source 10 that includes an LED die 11, a converter plate 12 and a lens 13. Light source 10 is designed to operate at higher temperatures than conventional white-light LED light sources. For example, light source 10 can operate for extended periods at 125° C. without any loss in the intensity of emitted white light because light source 10 has no phosphor particles embedded in silicone or epoxy resins. Phosphor particles are embedded in converter plate 12, which is glass or ceramic as opposed to silicone or epoxy. In addition, the total radiant flux of light emitted by light source 10 is increased by the chip-level lens 13, which is also made of glass or ceramic. Light source 10 can emit about 300 lumens of radiant flux without any significant performance decline over a long operational life in a vehicle headlight. Each vehicle headlight typically includes multiple units of light source 10.

In the embodiment of FIG. 1, LED die 11 of light source 10 is flip-chip mounted onto a mounting substrate 14. LED die 11 converts electrical energy to light, which is emitted from active layers of semiconductor material sandwiched between oppositely doped layers when a voltage is applied across the doped layers. In the flip-chip orientation of LED die 11 in FIG. 1, a buffer layer 15 is disposed beneath a sapphire substrate 16. In the original orientation of the manufacturing steps, however, the buffer layer 15 and other layers are deposited on top of the sapphire substrate. Below buffer layer 15 is the multi-layer epitaxial structure that emits blue light at a wavelength of approximately 450 nm. An n-type gallium nitride (n-GaN) layer 17 is disposed beneath the buffer layer 15. An active layer 18 is disposed beneath the n-GaN layer 17, and a p-GaN layer 19 is disposed beneath the active layer 18. Under the p-GaN layer 19 is a transparent conductive layer 20 of indium tin oxide (ITO). An N-electrode 21 of the LED die 11 is disposed in an N-trench at the right in the diagram and makes electrical contact with the n-GaN layer 17. The ITO layer 20 forms a P-electrode of the LED die 11. Conductive traces 22 on the upper surface of the mounting substrate 14 supply current through the N-electrode 21 and the P-electrode to the LED die 11 so that light is emitted from the active layer 18. Mounting substrate 14 is an aluminum nitride (AlN) substrate or a metal core printed circuit board (MCPCB).

In the flip-chip orientation of LED die 11, converter plate 12 is disposed above sapphire substrate 16. A very thin bonding layer 23 of metal oxide disposed over sapphire substrate 16 is used to attach converter plate 12 to LED die 11. Bonding layer 23 is less than one micron thick. In one embodiment, bonding layer 23 is a metal oxide such as magnesium oxide (MgO) and has a thickness of 0.1 microns. In comparison, converter plate 12 is between 60 and 100 microns thick. A second bonding layer 24 of metal oxide is used to bond chip-level lens 13 to the upper surface of converter plate 12. Bonding layer 24 is also less than one micron thick. In other embodiments, bonding layers 23-24 can be made of chromium oxide, nickel oxide, indium tin oxide or tungsten oxide. In one embodiment, lens 13 is made of glass.

Converter plate 12 is made by sintering glass powder mixed with particles 25 of phosphor, such as cerium-doped yttrium aluminum garnet (Ce:YAG). The phosphor particles 25 in the resulting phosphor-glass are dispersed homogeneously. No phosphor is embedded in the hemispherical glass lens 13 because the greater amount of phosphor in the middle of the lens compared to the thinner edges of the lens would result in color-over-angle anomalies in which the emitted light is bluer at some angles and yellower at other angles. LED light source 10 is particularly suited to automotive applications that involve high operating temperatures because the items attached above the LED die 11 are composed entirely of inorganic materials. The bonding layers are made of metal oxides, and the converter plate 12 and lens 13 are made of glass or ceramic. Even under extended periods of high operating temperatures, the structural integrity of the components of the LED light source 10 does not deteriorate because there are no organic resins that can deform under the high temperatures, such as methyl-based or phenol-based silicones. The phosphor particles are stably held in the glass even under extreme vibration at high temperatures and high humidity over the long operating life of a vehicle. The operating conditions experienced by the headlights of a vehicle are particularly damaging to a light source that includes phosphor particles embedded in an organic matrix such as silicone or epoxy because the matrix is shaken at the same time that the matrix is subjected to extreme heat, which hastens the breakdown of the organic matrix and the performance of the phosphor. In one embodiment, the glass of the converter plate 12 is borosilicate glass $SiO_2$—$B_2O_3$—Mg, which has a refractive index of about 1.46.

When a drive current passes through the N-electrode 21 and the P-electrode, the gallium-nitride LED junction of LED die 11 emits blue light with a wavelength of about 452 nanometers. The blue light that is emitted downwards and towards to the sides of LED die 11 is reflected and travels up through converter plate 12 together with the blue light that is directly emitted upwards. The phosphor dispersed in converter plate 2 converts a portion of the blue light generated by the LED junction into light in the yellow region of the optical spectrum. The combination of the blue and yellow light is perceived as "white" light by a human observer.

In another embodiment, two types of phosphors are embedded in converter plate 2. The first type of phosphor particles 25 converts the blue light into a longer reddish light, while the second type of phosphor particles 25 converts the blue light into a relatively shorter yellowish light. For example, the first type of phosphor is a mixture of YAG and a nitride phosphor, while the second type of phosphor is just YAG. The mixture of reddish, yellowish and bluish light produces a whiter light than just a mixture of yellow and blue, which can be perceived as a bluish headlight beam.

The design and materials of LED light source 10 increase the radiant flux of light emitted by the light source. The materials for the LED light source 10 above the flip-chip mounted LED die 11 are chosen to have indices of refraction that are relatively similar to that of sapphire substrate 16 in order to reduce the amount of light that is reflected back down as the blue light exits the LED die 11 upwards and passes through the different materials of the bonding layers 23-24, converter plate 12 and lens 13. For blue light with a wavelength of about 450 nanometers, sapphire has a refractive index of about 1.78. The bonding layers 23-24 of metal oxide have a refractive index of about 1.45. The borosilicate glass of converter plate 12 and lens 13 has a refractive index of about 1.46. The yellow light emitted from the phosphor particles 25 in converter plate 12 is also not reflected as it passes through the boundaries between different mediums because the refractive indices of converter plate 12, bonding layer 24 and glass lens 13 are all about the same.

The luminous intensity of LED light source 10 is also increased by mounting the chip-level lens 13 above each individual LED die. For the automotive application of a vehicle headlight, the intensity of the headlight beam is the critical factor. Adding a hemispherical lens that does not contain phosphor above the phosphor glass 12 increases the luminous intensity of the headlight beam in lumens per steradian (lm/sr=candela) by at least 7% compared to having no lens mounted to converter plate 12.

The luminous flux emitted by a light source with a single typical LED die is too small to generate a sufficiently bright headlight beam for a vehicle. For example, LED light source 10 with a single LED die 11 generates a luminous flux of about 300 lumens. In one embodiment, a luminous flux of at least 1800 lumens is desired for the high beam of a vehicle headlight. Thus, six LED light sources 10 are placed in a linear array to generate the desired 1800 lumens. By focusing the light emitted from the six light sources in a beamwidth of 35 degrees (equivalent to a solid angle of 65 steradians), the 1800 lumens result in a luminous intensity of over six thousand candela. By individually focusing the light emitted from the six LED light sources using six chip-level lenses 13, a headlight beam with a higher luminous intensity can be generated than by using only a single larger lens to focus the light from the linear array of six light sources. For example, the light emitted from the six LED light sources can be directed towards a larger reflective lens. Thus, the performance of the headlight light source is increased by more than seven percent by mounting a chip-level lens on top of the converter plate of phosphor glass attached to each LED die. In other embodiments, a different number of LED light sources 10 are placed in a linear array based on the luminous flux output by each LED die and the total luminous intensity desired for the headlight beam.

Figure 2:
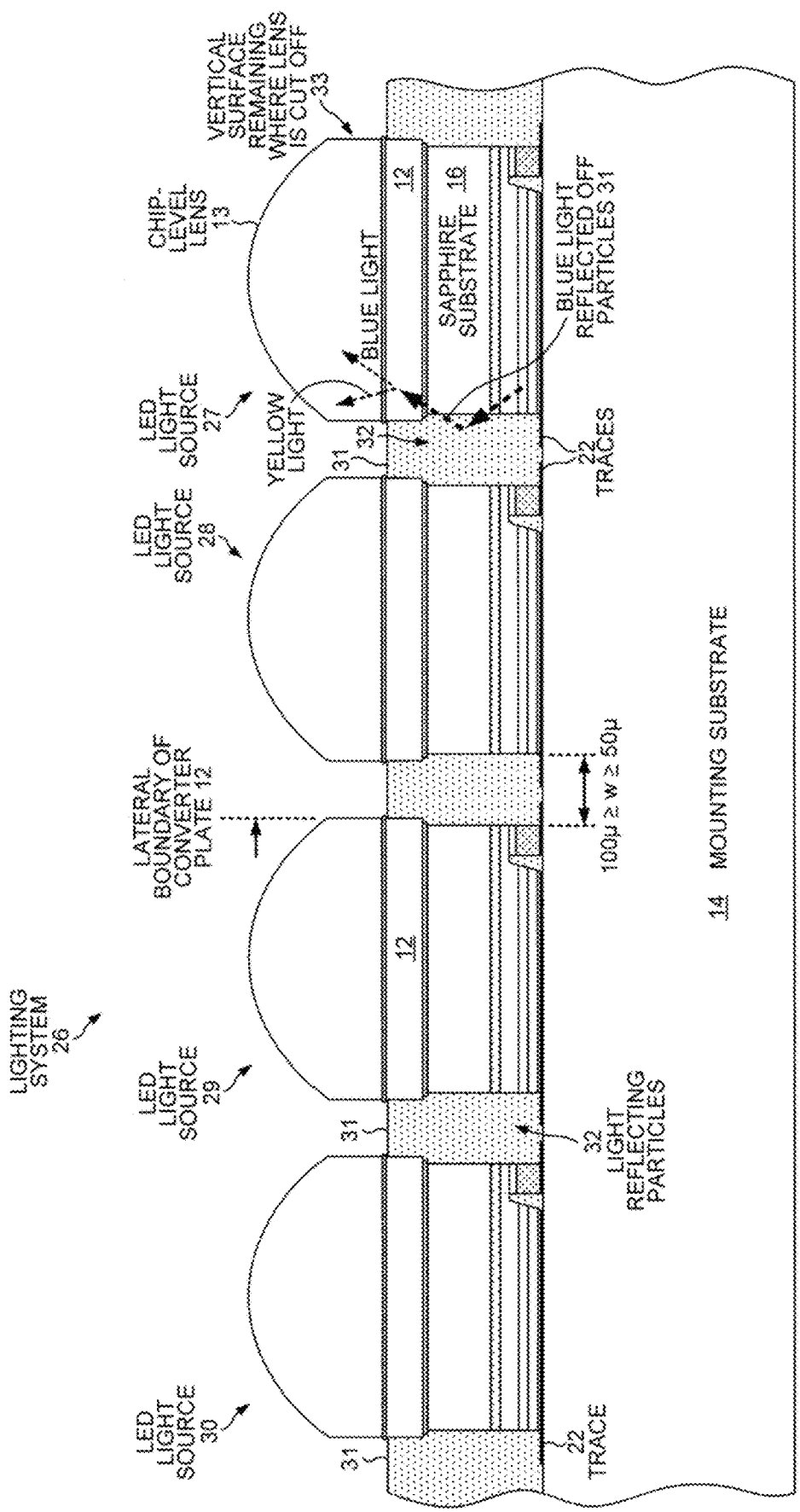
FIG. 2 is a cross-sectional view of a lighting system that includes a linear array of four LED light sources of the type shown in FIG. 1.

FIG. 2 shows a cross-sectional view of a lighting system 26 that includes a linear array of four light sources 27-30 of the type shown in FIG. 1. The LED dies 11 of the light sources 27-30 are bonded to traces 22 on mounting substrate 14. The traces 22 are patterned from a metal layer that is deposited on an insulating layer over the substrate. A reflective material 31 is injected between and around the light sources 27-30. Reflective material 31 includes light reflecting particles 32 dispersed in a transparent carrier material that scatter light striking the particles. In one embodiment, the particles 32 are spheres of titanium dioxide ($TiO_2$). The scattering particles 32 have diameters that are greater than the wavelength of the light generated by the LED dies 11, which is about 452 nm. Reflective material 31 reflects the blue light from the LED dies 11 that exits the sides of the light sources 27-30. Most of the blue light that is emitted out the sides of the LED dies 11 is reflected back into the light sources 27-30 and up through converter plate 12. The blue light that is reflected back through converter plate 12 is either converted to longer wavelength yellowish light by phosphor particles 25 or passes up through converter plate 12 as blue light. If the thickness of the reflective material 31 on the sides of the light sources 27-30 is at least one hundred microns, then more than 99% of the light exiting the sides of the light sources 27-30 will be reflected back towards the light sources 27-30. The reflectivity decreases as the thickness of the reflective material 31 covering the sides of the light sources 27-30 decreases. For example, about 97% of the light exiting the sides of the light sources 27-30 is reflected back when the thickness of the reflective material 31 is about fifty microns.

In the automotive application of lighting system 26 that uses light sources 27-30 in a vehicle headlight, it is desirable to place the LED dies of the linear array as close as possible to one another so that the emitted light will not be perceived as coming from multiple individual light sources. The light source of the headlight is to be perceived as a single bar of light. However, the spacing between the light sources 27-30 should be at least fifty microns so that at least 97% of the light exiting the sides of the light sources 27-30 is reflected back by material 31 and exits out the top of the light sources through the converter plates 12. The optimum spacing between the LED light sources 27-30 is 50-100 microns.

Figure 3:
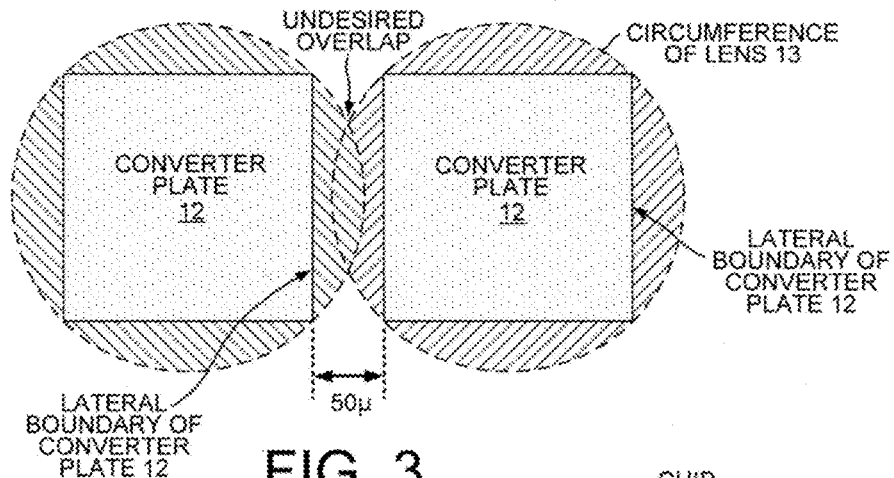
FIG. 3 illustrates the undesired overlap of lenses on adjacent light sources that are tightly spaced if the portions of the lenses that extend beyond the lateral boundaries of the converter plates are not cut off.

FIG. 3 shows the undesired overlap of lenses 13 on adjacent light sources that are spaced less than fifty microns apart if the portions of the lenses that extend horizontally beyond the lateral boundaries of the converter plates 12 are not cut off. If approximately hemispherical lenses are placed over the converter plates 12, the edges of the lenses on adjacent light sources will overlap if the light sources are spaced fifty microns apart and if each lens is sized to cover the entire top surface of the converter plate. Therefore, the portions of each lens 13 that extend outside the lateral boundary of the converter plate 12 are truncated. Simply mounting a smaller hemispherical lens over the converter plate 12 would be a suboptimal solution to the overlap problem because the corners of the converter plate would not be covered by the lens, and the light exiting from the corners of the converter plate would not be focused by the lens.

Figure 4:
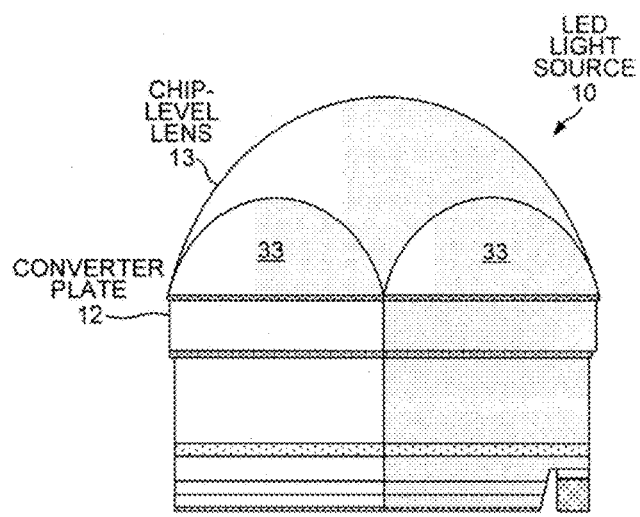
FIG. 4 shows an LED light source of the type shown in FIG. 1 viewed from a corner such that two adjacent sides of the light source are visible.

FIG. 4 shows LED light source 10 viewed from a corner such that two adjacent sides of the light source are visible. The vertical surfaces 33 of the chip-level lens 13 are apparent where the portions of the lens that extended beyond the lateral boundary of the converter plate 12 were cut off. The front views of the surfaces 33 are not shown in FIGS. 1-2.

Figure 5:
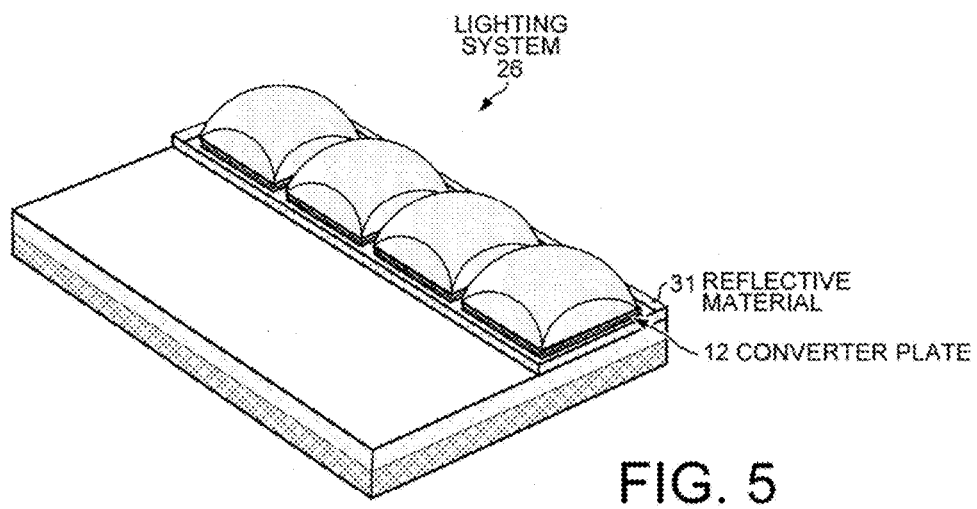
FIG. 5 is a perspective view of the lighting system of FIG. 2 showing four truncated chip-level lenses mounted on the converter plates of the four light sources.

FIG. 5 is a perspective view of lighting system 26 of FIG. 2 showing four truncated chip-level lenses 13 mounted on the converter plates 12 of the four light sources 27-30. The relative heights of the LED dies 11, the converter plates 12 and the lenses 13 are not shown to scale in FIG. 2. FIG. 5 is a more accurate representation of the relative dimensions of the dies 11, plates 12 and lenses 13. The dies 11 and plates 12 are much thinner than shown in FIG. 2 compared to the size of the lenses 13.

Figure 6:
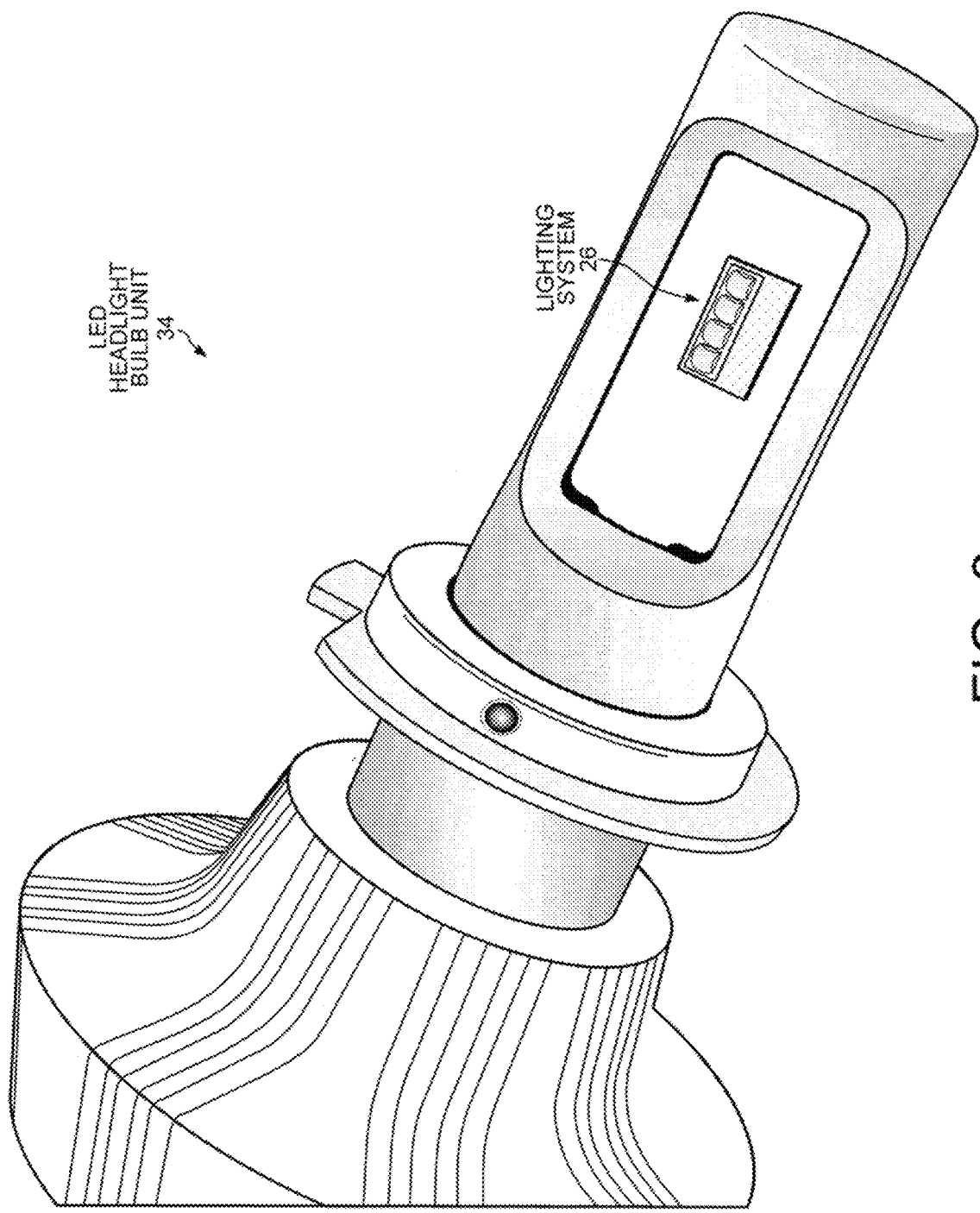
FIG. 6 is a perspective view of the lighting system of FIG. 5 mounted in an LED headlight bulb unit for use in a motor vehicle.

FIG. 6 is a perspective view of the lighting system 26 of FIG. 5 mounted in an LED headlight bulb unit 34 of a motor vehicle. The LED light sources 27-30 of lighting system 26 are particularly suited to automotive lighting applications because the entirely inorganic materials of the converter plate 12, chip-level lens 13 and bonding layers 23-24 do not break down under extended periods of extreme vibration at high operating temperatures as do lighting systems that contain silicone or epoxy resins.

Figure 7:
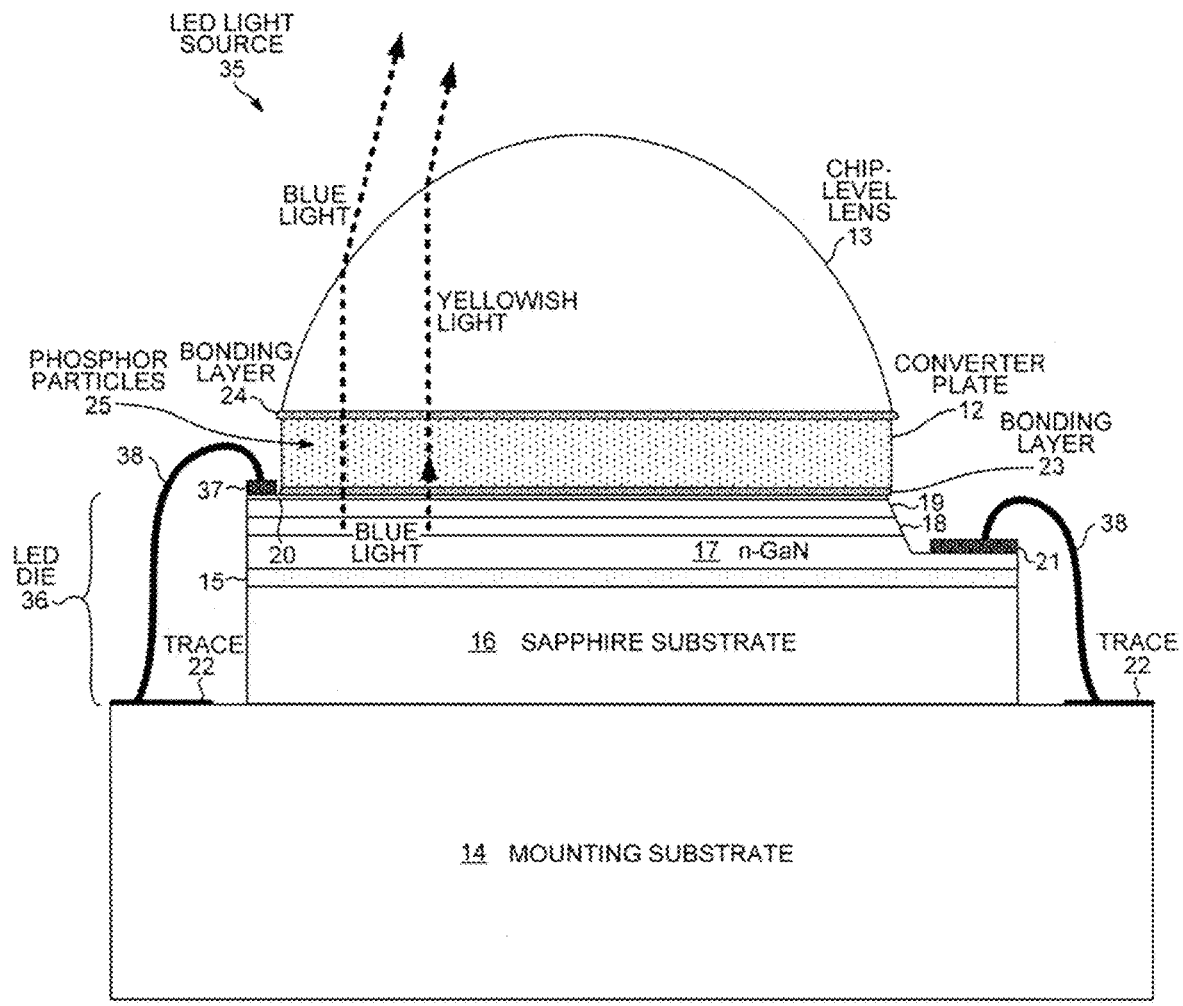
FIG. 7 is a cross-sectional view of another embodiment of an LED light source in which a lateral LED die is vertically mounted to a mounting substrate.

FIG. 7 is a cross-sectional view of another embodiment of an LED light source 35 in which a lateral LED die 36 is vertically mounted to mounting substrate 14. LED die 36 has a P-electrode 37 electrically coupled to ITO layer 20. P-electrode 37 and n-electrode 21 are non-transparent metal layers. P-electrode 37 and N-electrode 21 are electrically coupled to the conductive traces 22 by bond wires 38. During operation of lateral LED die 36, a voltage is placed across P-electrode 37 and N-electrode 21 causing a current to flow from P-electrode 37 to N-electrode 21 and thereby causing blue light to be generated in active layer 18. In the lateral LED embodiment of FIG. 7, blue light can pass directly from the multi-layer epitaxial structure of gallium nitride layers 17-19 into the phosphor glass of converter plate 12 without passing through sapphire substrate 16.

The vertical LED embodiment of FIG. 1 has at least three advantages over the lateral LED embodiment of FIG. 7. First, there is more reflection of blue light back towards LED die 36 as the light passes up through the first bonding layer 23 because the difference between the refractive indices of gallium nitride (2.48) and metal oxide bonding layer 23 (1.45) is greater than the difference between the refractive indices of sapphire substrate 16 (1.78) and bonding layer 23 (1.45). Second, converter plate 12 cannot extend over the locations at which the bond wires 38 contact P-electrode 37 and N-electrode 21. Thus, some blue light that is emitted around the electrodes passes up an out of LED die 36 without passing through converter plate 12 and without the possibility of being converted to longer wavelength yellowish light. Moreover, P-electrode 37 and n-electrode 21 are non-transparent metal layers through which the emitted blue light cannot pass. Third, the bond wires complicate the assembly of the linear array of light sources 35. The reflective material 31 must be injected around the bond wires 38 between the light sources 35. And the light sources cannot have the desired optimum spacing of no more than one hundred microns between light sources on the sides of the light sources to which the bond wires are attached. The flip-chip orientation of LED die 11 of the embodiment of FIG. 1 solves these three issues. In yet another embodiment, a non-linear array of LED light sources forms the lighting system 26. Each side of the non-linear array has at least two LED dies. Achieving the optimum tight spacing of light sources in a non-linear array that is desired for a vehicle headlight application is even more difficult with lateral LED dies that must be electrically connected using bond wires.

Figure 8:
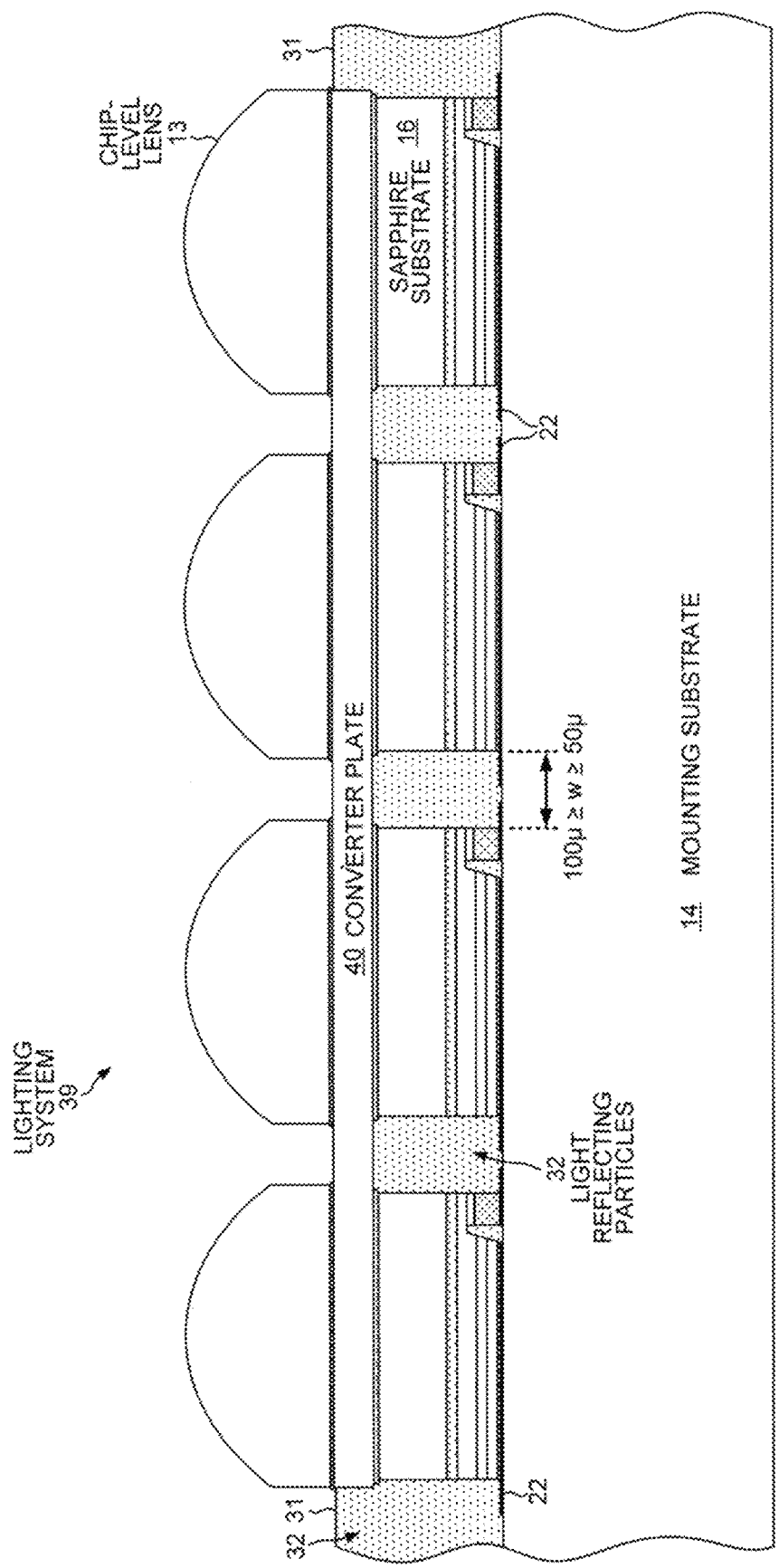
FIG. 8 is a cross-sectional view of another embodiment of a lighting system with a linear array of light sources connected by a common, unitary converter plate of phosphor glass.

FIG. 8 shows a cross-sectional view of another embodiment of a lighting system 39 that includes a linear array of multiple light sources. The LED light sources of lighting system 39 are similar to the light sources 27-30 of lighting system 26 of FIG. 2 except that the light sources of FIG. 8 share a common, unitary converter plate 40 of phosphor glass. The larger unitary converter plate 40 reduces the amount of blue light that can exit upwards out of the light sources without passing through a converter plate containing phosphor. Thus, the bar of phosphor glass 40 covering all four light sources improves the uniformity of the emitted light and further precludes lighting system 39 from being perceived as four separate light sources. In addition, the manufacture and mounting of the unitary converter plate 40 is less complicated than making and mounting individual smaller converter plates.

Figure 9:
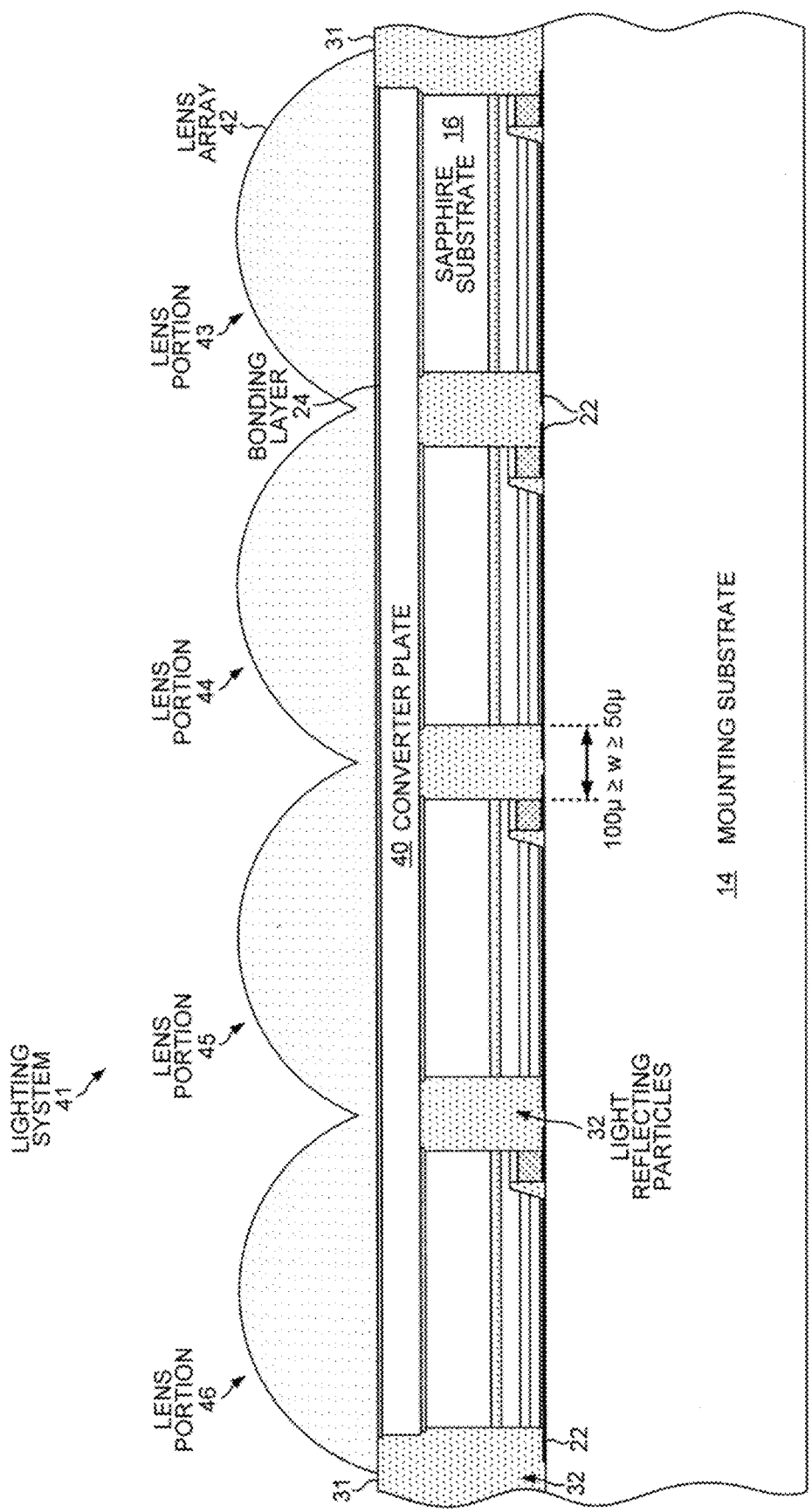
FIG. 9 is a cross-sectional view of yet another embodiment of a lighting system including a linear array of light sources that have a common converter plate and a common, unitary lens array.

FIG. 9 shows a cross-sectional view of yet another embodiment of a lighting system 41 that includes a linear array of multiple light sources. The LED light sources of lighting system 41 are similar to the light sources 27-30 of lighting system 26 of FIG. 2 except that the light sources of FIG. 9 share a common converter plate 40 as well as a common, unitary lens array 42. The second bonding layer 24 of metal oxide covers the entire upper surface of common converter plate 40 and bonds lens array 42 to plate 40. The common lens array 42 includes separate curved lens portions 43-46 centered over each of the four LED dies 11. The edges of individual lenses need not be truncated between the LED dies in order to achieve the desired tight spacing between the light sources. The curved lens portions 43-46 are formed on unitary lens array 42 at locations that accommodate a spacing between the LED dies 11 of 50-100 microns.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A device comprising:
   a substrate;
   a first LED die mounted on the substrate;
   a first lens;
   a first converter plate disposed between the first LED die and the first lens, wherein the first converter plate includes phosphor particles embedded in glass or ceramic;
   a second LED die mounted on the substrate;
   a second lens;
   a second converter plate disposed between the second LED die and the second lens; and
   a reflective material that includes light scattering particles dispersed in a transparent carrier, wherein the reflective material is disposed between the first LED die and the second LED die but not laterally over either the first LED die or the second LED die.

2. The device of claim 1, wherein the first lens does not extend outside any lateral boundary of the first converter plate.

3. The device of claim 1, wherein no organic material is included in either the first converter plate or the first lens.

4. The device of claim 1, wherein the device includes no phosphor particles embedded in silicone or epoxy.

5. The device of claim 1, wherein the first converter plate and the second converter plate are integrally formed as a unitary converter plate.

6. The device of claim 1, wherein the first LED die is flip-chip mounted onto the substrate.

7. The device of claim 1, wherein the device is part of a headlight bulb unit of a motor vehicle.

8. The device of claim 1, wherein the first converter plate has a planar top surface.

9. A device comprising:
a substrate;
a first LED die mounted on the substrate;
a first lens;
a first converter plate disposed between the first LED die and the first lens, wherein the first converter plate includes phosphor particles embedded in glass or ceramic;
a second LED die mounted on the substrate, wherein the first LED die is spaced apart from the second LED die by no more than one hundred microns and no less than fifty microns;
a second lens;
a second converter plate disposed between the second LED die and the second lens; and
a reflective material that includes light scattering particles dispersed in a transparent carrier, wherein the reflective material is disposed between the first LED die and the second LED die.

10. The device of claim 9, wherein the transparent carrier is silicone.

11. A lighting unit of a vehicle, comprising:
an LED die;
a substrate;
a converter plate, wherein the LED die is disposed between the substrate and the converter plate, and wherein the converter plate includes phosphor particles embedded in glass or ceramic; and
a lens, wherein the converter plate is disposed between the LED die and the lens.

12. The lighting unit of claim 11, wherein no organic material is included in either the converter plate or the lens.

13. The lighting unit of claim 11, wherein the LED die is flip-chip mounted on the substrate.

14. The lighting unit of claim 11, wherein the lighting unit is a headlight module.

15. The lighting unit of claim 11, wherein the lens does not extend outside any lateral boundary of the converter plate.

16. A device comprising:
a substrate;
an LED die mounted on the substrate;
a converter plate, wherein the LED die is disposed between the substrate and the converter plate, and wherein the converter plate includes phosphor particles embedded in glass or ceramic;
a bonding layer disposed between the LED die and the converter plate, wherein the bonding layer has a thickness of one micron or less; and
a lens, wherein the converter plate is disposed between the LED die and the lens.

17. The device of claim 16, wherein the lens is shaped approximately as a hemisphere in which portions of the hemisphere that extend outside the lateral boundaries of the converter plate are truncated.

18. The device of claim 16, wherein the bonding layer is made of a metal oxide selected from the group consisting of: magnesium oxide, chromium oxide, nickel oxide, indium tin oxide and tungsten oxide.

19. The device of claim 16, wherein the lens is made of borosilicate glass.

20. The device of claim 16, wherein no organic material is included in any of the converter plate, the lens or the bonding layer.

21. The device of claim 16, wherein the device is part of a headlight module of a vehicle.

* * * * *